United States Patent
Abrahams et al.

(10) Patent No.: US 12,332,710 B2
(45) Date of Patent: *Jun. 17, 2025

(54) TECHNIQUES FOR TESTING PLP CAPACITORS

(71) Applicant: Kioxia Corporation, Tokyo (JP)

(72) Inventors: Paul Abrahams, San Jose, CA (US); Ilya Shlimenzon, San Jose, CA (US)

(73) Assignee: KIOXIA CORPORATION, Tokyo (JP)

( * ) Notice: Subject to any disclaimer, the term of this patent is extended or adjusted under 35 U.S.C. 154(b) by 1210 days.

This patent is subject to a terminal disclaimer.

(21) Appl. No.: 16/919,443

(22) Filed: Jul. 2, 2020

(65) Prior Publication Data
US 2020/0393504 A1 Dec. 17, 2020

Related U.S. Application Data (63) Continuation of application No. 15/703,664, filed on Sep. 13, 2017, now Pat. No. 10,705,129.

(51) Int. Cl.
*H02J 7/00* (2006.01)
*G01R 21/00* (2006.01)
(Continued)

(52) U.S. Cl.
CPC .............. *G06F 1/30* (2013.01); *G01R 21/006* (2013.01); *G01R 27/2688* (2013.01);
(Continued)

(58) Field of Classification Search
CPC ........... G06F 1/30; G06F 1/305; H01G 11/12; G11C 5/141; G11C 29/021; G11C 29/50;
(Continued)

(56) References Cited

U.S. PATENT DOCUMENTS

| 6,515,464 B1 | 2/2003 | Darmawaskita et al. |
| 7,395,452 B2 | 7/2008 | Nicholson et al. |

(Continued)

FOREIGN PATENT DOCUMENTS

| CN | 103870400 A | 6/2014 |
| WO | 2012050818 A1 | 4/2012 |

OTHER PUBLICATIONS

Battery University, "BU-209: How Does a Supercapacitor Work?" Cadex—Powering Warehouse Logistics, Apr. 21, 2017, pp. 1-20.
(Continued)

*Primary Examiner* — Zixuan Zhou
(74) *Attorney, Agent, or Firm* — Foley & Lardner LLP (57) ABSTRACT

A solid state drive (SSD) with improved techniques for testing power loss protection (PLP) capacitors and a method for testing PLP capacitors of SSDs is disclosed. In one embodiment, the SSD includes a memory controller and one or more non-volatile memory devices and a volatile memory device coupled to the memory controller. The SSD also includes a PLP capacitor configured to supply a first voltage to the memory controller, the one or more non-volatile memory devices, and the volatile memory device in the event of a power loss or failure of the SSD. In one embodiment, the PLP capacitor is further configured to increase the first voltage to a second voltage prior to testing the PLP capacitor. In another embodiment, the memory controller is configured to reduce a volume of data stored in the volatile memory device prior to testing the PLP capacitor.

22 Claims, 4 Drawing Sheets

(51) Int. Cl.
*G01R 27/26* (2006.01)
*G01R 31/30* (2006.01)
*G06F 1/30* (2006.01)
*G11C 5/14* (2006.01)
*G11C 29/02* (2006.01)
*G11C 29/50* (2006.01)
*H01G 11/12* (2013.01)
*G01R 31/64* (2020.01)

(52) U.S. Cl.
CPC ......... *G01R 31/3004* (2013.01); *G06F 1/305* (2013.01); *G11C 5/141* (2013.01); *G11C 29/021* (2013.01); *G11C 29/50* (2013.01); *H01G 11/12* (2013.01); *G01R 31/64* (2020.01)

(58) Field of Classification Search
CPC .. G01R 31/64; G01R 31/3004; G01R 21/006; G01R 27/2688
USPC ....................................................... 320/167
See application file for complete search history.

(56) References Cited

U.S. PATENT DOCUMENTS

| | | | |
|---|---|---|---|
| 7,451,348 B2 | 11/2008 | Pecone et al. | |
| 7,533,215 B2 | 5/2009 | Faber | |
| 7,661,002 B2 | 2/2010 | Pecone et al. | |
| 7,989,987 B2 | 8/2011 | McDonald | |
| 8,031,551 B2 | 10/2011 | Wilson | |
| 8,389,160 B2 | 3/2013 | Venkatachalam et al. | |
| 9,390,767 B2 | 7/2016 | Sweere et al. | |
| 9,520,191 B2 | 12/2016 | Moshayedi et al. | |
| 9,645,769 B2 | 5/2017 | Chadha et al. | |
| 9,705,402 B1 | 7/2017 | Carpenter, Jr. et al. | |
| 2005/0085861 A1 | 4/2005 | Herbert | |
| 2006/0066316 A1 | 3/2006 | Rozen et al. | |
| 2008/0246492 A1 | 10/2008 | Ritter et al. | |
| 2008/0277171 A1 | 11/2008 | Wright | |
| 2009/0021239 A1 | 1/2009 | Hashimoto | |
| 2010/0295568 A1 | 11/2010 | Ostrovsky et al. | |
| 2011/0066872 A1* | 3/2011 | Miller | G06F 1/30 713/340 |
| 2013/0278273 A1 | 10/2013 | Barlag et al. | |
| 2013/0285449 A1 | 10/2013 | Schmidt et al. | |
| 2014/0189212 A1 | 7/2014 | Slaight et al. | |
| 2015/0194418 A1 | 7/2015 | Bade et al. | |
| 2015/0268709 A1* | 9/2015 | Morning-Smith | G01R 31/64 307/64 |
| 2016/0070329 A1* | 3/2016 | Aochi | G06F 1/263 714/42 |
| 2017/0063106 A1 | 3/2017 | Armstrong | |
| 2017/0069356 A1 | 3/2017 | Schmidt et al. | |
| 2017/0185335 A1* | 6/2017 | Pardoe | G06F 1/3206 |
| 2017/0317594 A1 | 11/2017 | Lind | |
| 2018/0032390 A1 | 2/2018 | Rahmanian et al. | |
| 2018/0097391 A1 | 4/2018 | Baby et al. | |
| 2019/0258418 A1 | 8/2019 | Liu et al. | |

OTHER PUBLICATIONS

Michael Helmlinger, "PMP9766 Test Report—Supercapacitor Backup Power Supply With Active Cell Balancing," Texas Instruments, Application Report, SLVA726 - Sep. 2015, pp. 1-12.

* cited by examiner

TECHNIQUES FOR TESTING PLP CAPACITORS

CROSS-REFERENCE TO RELATED CASES

This application is a continuation of application Ser. No. 15/703,664 filed Sep. 13, 2017, the entire contents of which is incorporated herein by reference.

FIELD OF THE INVENTION

This invention generally relates to power loss protection (PLP) for solid state drives (SSDs), and more particularly, to improved techniques for testing PLP capacitors.

BACKGROUND OF THE INVENTION

As the SSD plays an increasingly important role in computer and enterprise storage, there is a correlated increase in importance and reliance on the use of backup power sources, such as PLP capacitors, to help prevent data loss in the SSD from occurring due to a power outage or power loss. When a power outage or power loss occurs for a host device, such as a computer, with an SSD, the energy stored by the PLP capacitor provides backup power to ensure that all pending commands are successfully completed or aborted by the SSD, all critical data is saved, and the SSD can shut down properly. Absent the PLP capacitor, critical data that is lost during the power outage or power loss may result in unrecoverable errors once power is restored.

In order to ensure that the PLP capacitor has sufficient energy to operate the SSD during a power loss or failure event, the SSD periodically tests the PLP capacitor. During this time, the energy in the PLP capacitor may be reduced and may fall below a minimum required energy needed by the SSD to complete all pending commands, store all critical data, and shut down properly. If this occurs, a power loss or failure event during testing may result in the loss of critical data and may render the SSD non-functional or "bricked."

There is, therefore, an unmet demand for improved techniques for testing PLP capacitors of SSDs to guard against the loss of critical data in the event of a power loss or power failure event during testing.

BRIEF DESCRIPTION OF THE INVENTION

In one embodiment, an SSD includes a memory controller, one or more non-volatile memory devices communicatively coupled to the memory controller, and a volatile memory device communicatively coupled to the memory controller. The SSD further includes a PLP capacitor electrically coupled to the memory controller, the one or more non-volatile memory devices, and the volatile memory device. The PLP capacitor is configured to supply a first voltage to the memory controller, the one or more non-volatile memory devices, and the volatile memory device in the event of a power loss or failure of the SSD. The PLP capacitor is further configured to increase the first voltage to a second voltage prior to performing a test of an amount of energy stored by the PLP capacitor. The increase in voltage from the first voltage to the second voltage offsets at least a part of an energy lost by the PLP capacitor during testing.

In one embodiment, the test of the PLP capacitor is a discharge test whereby a known resistance, current source, or load is applied across the PLP capacitor. In one embodiment, the voltage increase from the first voltage to the second voltage corresponds to an increase in energy that is substantially equal to the energy lost by the PLP capacitor during testing. In one embodiment, the voltage increase from the first voltage to the second voltage corresponds to an increase in energy that is in excess of the energy lost by the PLP capacitor during testing. In one embodiment, the PLP capacitor is restored to the first voltage after testing the PLP capacitor. In one embodiment, the PLP capacitor comprises one or more capacitors. In one embodiment, the one or more capacitors are "supercapacitors" or "ultracapacitors." In one embodiment, the PLP capacitor is a de-rated capacitor.

In one embodiment, an SSD includes a memory controller, one or more non-volatile memory devices communicatively coupled to the memory controller, and a volatile memory device communicatively coupled to the memory controller. The SSD further includes a PLP capacitor electrically coupled to the memory controller, the one or more non-volatile memory devices, and the volatile memory device. The PLP capacitor is configured to supply an operating voltage to the memory controller, the one or more non-volatile memory devices, and the volatile memory device in the event of a power loss or failure of the SSD. The memory controller is configured to reduce a volume of data stored in the volatile memory device requiring hardening in the event of the power loss or failure of the SSD prior to performing a test of an amount of energy stored by the PLP capacitor.

In one embodiment, the test of the PLP capacitor is a discharge test whereby a known resistance, current source, or load is applied across the PLP capacitor. In one embodiment, the volatile memory device comprises a plurality of write buffers for storing data and the memory controller is further configured to withhold the use of one or more of the plurality of write buffers to store data prior to testing the PLP capacitor. In one embodiment, the memory controller is further configured to release the withheld one or more of the plurality of write buffers after testing the PLP capacitor. In one embodiment, the memory controller is further configured to allocate one or more of the plurality of write buffers for dummy write operations prior to testing the PLP capacitor. In one embodiment, the memory controller is further configured to re-allocate the one or more of the plurality of write buffers for dummy operations prior to testing the PLP capacitor for normal write operations after testing the PLP capacitor.

In one embodiment, the memory controller is further configured to reduce credits available to a host device to write data to the SSD prior to testing the PLP capacitor. In one embodiment, the memory controller is further configured to increase the credits available to the host device after testing the PLP capacitor. In one embodiment, the memory controller is further configured to reduce a number of concurrent write operations to the one or more non-volatile memory devices prior to testing the PLP capacitor. In one embodiment, the memory controller is further configured to increase the number of concurrent write operations to the one or more non-volatile memory devices after testing the PLP capacitor.

In one embodiment, the memory controller is further configured to store all of the data in the volatile memory device requiring hardening in the one or more non-volatile memory devices prior to testing the PLP capacitor. In one embodiment, the memory controller is further configured to restore all of the data in the volatile memory device requiring hardening from the one or more non-volatile memory devices after testing the PLP capacitor. In one embodiment, the PLP capacitor comprises one or more capacitors. In one embodiment, the one or more capacitors are "supercapacitors" or "ultracapacitors."

In one embodiment, a method for testing a PLP capacitor of an SSD includes increasing a voltage of the PLP capacitor from a first voltage to a second voltage and testing an amount of energy stored by the PLP capacitor. The PLP capacitor is configured to supply the first voltage to a memory controller, one or more non-volatile memory devices, and a volatile memory device in the event of a power loss or failure of the SSD. In one embodiment, the method further includes applying a known resistance, current source, or load to the PLP capacitor for a first time period, and measuring a drop in the voltage of the PLP capacitor over the first time period. In one embodiment, the method further includes removing the known resistance, current source, or load from the PLP capacitor after the first time period and restoring the voltage of the PLP capacitor to the first voltage. In one embodiment, the PLP capacitor comprises one or more capacitors. In one embodiment, the one or more capacitors are "supercapacitors" or "ultracapacitors."

In one embodiment, a method for testing a PLP capacitor of an SSD includes reducing a volume of data stored in a volatile memory device by a memory controller communicatively coupled to the volatile memory device, whereby the volume of data requires hardening in one or more non-volatile memory devices communicatively coupled to the memory controller. The method further includes testing an amount of energy stored by the PLP capacitor. The PLP capacitor is configured to supply an operating voltage to the memory controller, the one or more non-volatile memory devices, and the volatile memory device in the event of a power loss or failure of the SSD. In one embodiment, the method further includes applying a known resistance, current source, or load to the PLP capacitor for a first time period, and measuring a drop in the voltage of the PLP capacitor over the first time period. In one embodiment, the method further includes removing the known resistance, current source, or load from the PLP capacitor after the first time period and restoring the volume of data stored in the volatile memory device. In one embodiment, the PLP capacitor comprises one or more capacitors. In one embodiment, the one or more capacitors are "supercapacitors" or "ultracapacitors."

In one embodiment, the method further includes withholding, by the memory controller, use of one or more of a plurality of write buffers of the volatile memory device for storing data prior to testing the PLP capacitor. In one embodiment, the method further includes releasing, by the memory controller, use of one or more of the withheld plurality of write buffers after testing the PLP capacitor. In one embodiment, the method further includes allocating, by the memory controller, one or more of a plurality of write buffers of the volatile memory device for storing data for dummy write operations prior to testing the PLP capacitor. In one embodiment, the method further includes re-allocate, by the memory controller, the one or more of the plurality of write buffers for dummy write operations prior to testing the PLP capacitor for normal write operations after testing the PLP capacitor.

In one embodiment, the method further includes reducing, by the memory controller, a number of credits available to a host device to write data to the SSD prior to testing the PLP capacitor. In one embodiment, the method further includes increasing, by the memory controller, the number of credits available to the host device after testing the PLP capacitor.

In one embodiment, the method further includes reducing, by the memory controller, a number of concurrent write operations to the one or more non-volatile memory devices prior to testing the PLP capacitor. In one embodiment, the method further includes increasing, by the memory controller, a number of concurrent write operations to the non-volatile memory devices after testing the PLP capacitor. In one embodiment, the method further includes storing, by the memory controller, the volume of data in the volatile memory device in the one or more non-volatile memory devices prior to testing the PLP capacitor. In one embodiment, the method further includes restoring, by the memory controller, the volume of data in the volatile memory device from the one or more non-volatile memory devices after testing the PLP capacitor.

DETAILED DESCRIPTION OF THE INVENTION

Figure 1:
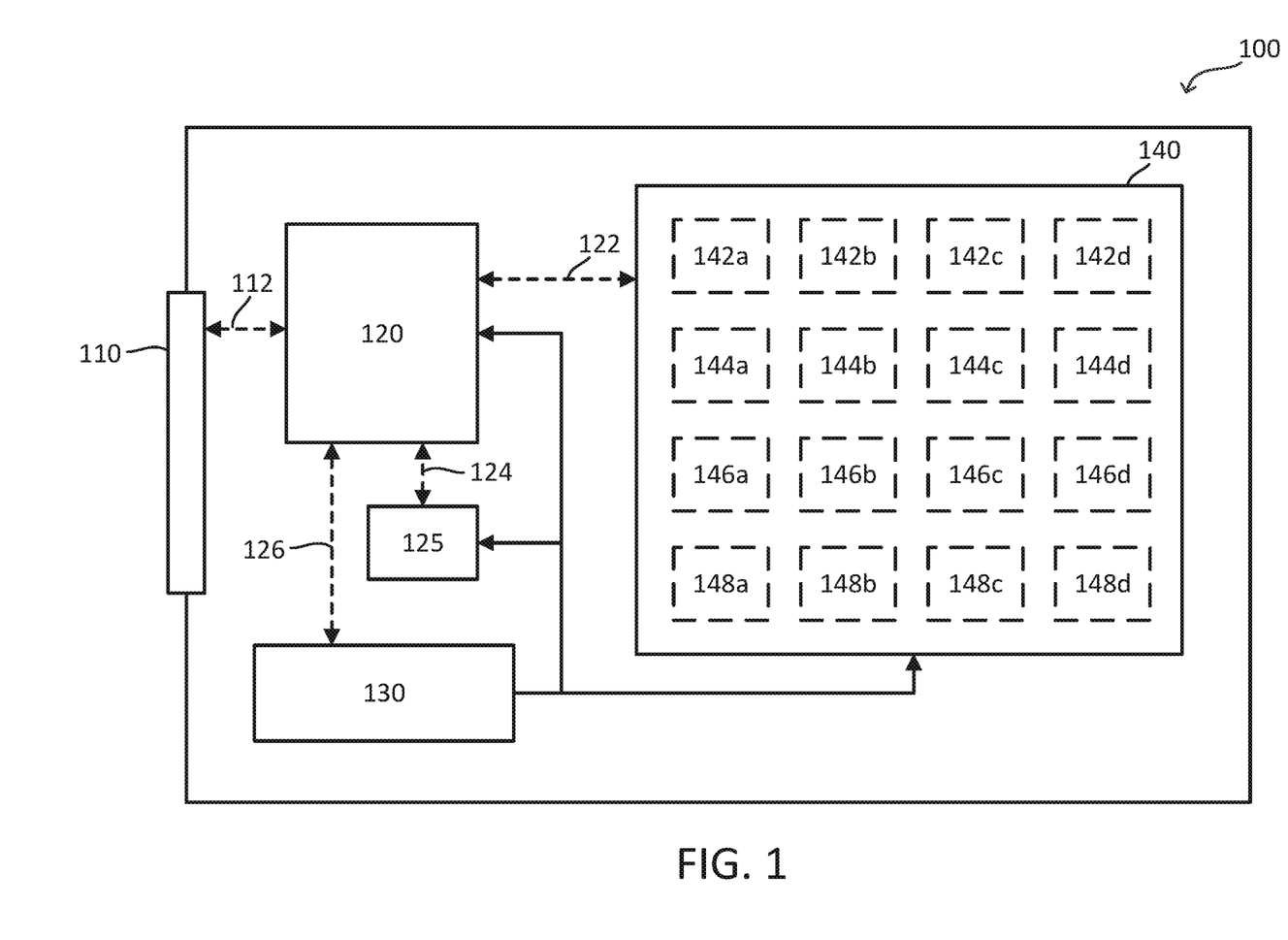
FIG. 1 is a block diagram of the structure of an SSD with a PLP capacitor, according to one embodiment of the invention.

FIG. 1 is a block diagram of the structure of an SSD 100 with a PLP capacitor 130, according to one embodiment of the invention. As shown in FIG. 1, an SSD memory controller 120 is in communication 112 with a host device (not shown) through a host interface 110. The host device may comprise any suitable device, such as a computer or mass storage appliance. The SSD 100 includes both a volatile memory 125, and an array of non-volatile memory devices 140. The volatile memory device 125 and the array of non-volatile memory devices 140 are in communication 124 and 122, respectively, with the SSD memory controller 120.

The array of non-volatile memory devices 140 comprises non-volatile memory devices 142*a-d*, 144*a-d*, 146*a-d*, and 148*a-d* that may be arranged in one or more channels in communication 122 with the SSD memory controller 120. While 16 non-volatile memory devices 142*a-d*, 144*a-d*, 146*a-d*, and 148*a-d* are shown in FIG. 1, the array of non-volatile memory devices 140 of the SSD 100 may comprise any suitable number of non-volatile memory devices 140 that are arranged in one or more channels in communication 122 with the SSD memory controller 120. In one embodiment, the volatile memory device 125 comprises a volatile memory DRAM buffer. The volatile memory device 125 need not be a single device of a unitary type, and may comprise multiple devices of different types, such as volatile SRAM and DRAM, capable of providing a volatile memory buffer for the SSD 100. In one embodiment, the non-volatile memory devices 142*a-d*, 144*a-d*, 146*a-d*, and 148*a-d* comprise NAND flash memory.

The PLP capacitor 130 is in communication 126 with the SSD memory controller 120 and electrically coupled to the SSD memory controller 120, the volatile memory device 125, and the array of non-volatile memory devices 140. The PLP capacitor 130 is configured to provide backup power in the form of an operating voltage to these devices in the event of a system power loss or failure event, such as where there is a power outage or where a power supply of the host device fails. This way, even if the SSD 100 experiences a sudden power loss or failure event, the PLP capacitor 130 provides sufficient backup power to the SSD memory controller 120, the volatile memory device 125, and the array of non-volatile memory devices 140 for a period of time so that critical data in the volatile memory device 125 such as logical-to-physical (L2P) address look-up tables (LUTs), data corresponding to pending write commands to the array of non-volatile memory devices 140, etc. can be written and saved in one or more of the non-volatile memory devices 142a-d, 144a-d, 146a-d, and 148a-d. This process is also referred to as "hardening" of the data in the volatile memory device 125.

The PLP capacitor 130 is typically of a type that is referred to as a "supercapacitor" or "ultracapacitor," but may also be of any suitable capacitor type capable of providing sufficient backup power for the SSD 100. The PLP capacitor 130 need not be a single device and may comprise multiple capacitors that can be arranged in banks or any other configuration capable of providing power to provide power loss protection for the SSD 100. The requisite energy storage capacity of the PLP capacitor 130 will depend on the a number of factors, including the power consumption of the SSD memory controller 120, the array of non-volatile memory devices 140, and the volatile memory device 125, and the amount of time needed to for the data in the volatile memory device 125 requiring hardening to be written to one or more of the non-volatile memory devices 142a-d, 144a-d, 146a-d, and 148a-d of the array 140.

The PLP capacitor 130 must also be capable of providing the required backup power for the required amount of time for the duration of the specified lifetime of the SSD 100 by the manufacturer. This can vary from manufacturer to manufacturer, and will depend on whether the SSD 100 is designed for consumer or enterprise applications among other considerations, and can range from 2 to up to 10 years, for example. During this time, the PLP capacitor 130 will likely slowly degrade and lose capacitance and stored energy. In order to guarantee the PLP capacitor 130 can supply the required backup power for the specified lifetime of the SSD 100, the PLP capacitor 130 is tested periodically to ensure it has a sufficient remaining energy capacity to meet the backup power requirements for the SSD 100. Because many applications of the SSD 100 require the SSD 100 to operate continuously, such as in a data center or other server environment, the SSD 100 is configured to test the PLP capacitor 130 during the normal operation of the SSD 100 (i.e. when the host device is actively writing and reading data to and from, respectively, the SSD 100) as there is no guarantee that there will be a convenient opportunity to test the PLP capacitor 130 outside of normal working conditions, such as during shutdown or initial power-up of the host device, for every application of the SSD 100.

In one embodiment, the test is a discharge test which involves applying a known resistance, current source, or load across the PLP capacitor 130 and measuring the voltage drop over time as the PLP capacitor 130 discharges through the load. The testing frequency of the PLP capacitor 130 may vary depending on a number of factors, including the specific configuration of the SSD 100, the intended application of the SSD 100, the specified operating lifetime of the SSD 100, etc., and may vary from about once a day, once every few days, or longer. Of course, this frequency can be adjusted to be more or less frequent depending on the specific circumstances and operational requirements of the SSD 100. The amount of time the load is applied to the PLP capacitor 130 for the discharge test may also vary depending on the load applied, but will typically range in the 10's of milliseconds (ms) or more.

By the end of the test, the PLP capacitor 130 may be discharged by 10-20%, or more, due to the $V^2$ relationship with energy. A 5% drop in voltage of the PLP capacitor 130 corresponds to a 10% drop in energy, and a 10% drop in voltage of the PLP capacitor 130 corresponds to almost a 20% drop in energy, for example. Because testing is performed during the normal operation of the SSD 100, when data is being written to and read from the SSD 100 by a host device, the capability of the PLP capacitor 130 to supply backup power likely will be reduced during this time, particularly toward the end of the test where the energy loss is greatest, and the risk of loss of critical data should a power loss or failure event occur is increased.

To reduce or even eliminate the risk of losing critical data during testing of the PLP capacitor 130, in one embodiment, the voltage of the PLP capacitor 130 is increased to partially or completely offset the energy discharged during testing prior to testing the PLP capacitor 130. This way, the PLP capacitor 130 will maintain a minimum voltage (and corresponding energy capacity) that meets or exceeds the operating voltage required by the SSD memory controller 120, the array of non-volatile memory devices 140, and the volatile memory device 125 for the duration of the test. In the event of a power loss or failure, the PLP capacitor 130 will have sufficient energy to ensure that any critical data requiring hardening in the volatile memory device 125 will be hardened in one or more of the non-volatile memory devices 142a-d, 144a-d, 146a-d, and 148a-d and the SSD 100 can be safely shut down. After the test of the PLP capacitor 130 has been completed, the voltage of the PLP capacitor 130 is restored to its original level prior to the increase.

Increasing the voltage of the PLP capacitor 130 for the duration of the testing will not measurably degrade the lifetime of the PLP capacitor 130 as the voltage increase is relatively small over a relatively short period of time. This is because, as previously discussed, during the test the PLP capacitor may experience a loss of 10-20% of energy, but the $V^2$ relationship with energy in the PLP capacitor 130 means that a relatively small increase or decrease in voltage will have a much larger impact on the energy gained or lost, respectively. Additionally, the duration the test is in the 10's of ms, for example ranging from 10 ms to 50 ms. As such, even if the PLP capacitor 130 is tested once per day during the specified lifetime of the SSD 100, the impact on the lifetime PLP capacitor 130 by increasing the voltage of the PLP capacitor 130 for duration of the test will be relatively minor, if any.

In one embodiment, the PLP capacitor 130 is a de-rated capacitor. A de-rated capacitor is one that normally operates at a de-rated voltage for longevity. For example, a 35V capacitor is de-rated to run at 28V to extend the lifetime of the capacitor. Thus, where the PLP capacitor 130 is a de-rated capacitor, the increase in voltage just before the discharge test takes place, ensuring sufficient backup power for the SSD memory controller 120, the array of non-volatile memory devices 140, and the volatile memory device 125 in case of a power loss or failure event, will have a negligible impact on the lifetime of the PLP capacitor 130 and will not cause any undue stress on the device by due to over-voltage or otherwise exceeding the electrical specification of the device.

In one embodiment, to minimize the risk of losing critical data during the testing of the PLP capacitor 130, the SSD memory controller 120 is configured to temporarily reduce or eliminate a volume of data buffered in the volatile memory device 125 requiring hardening in the event of the power loss or failure of the SSD 100 prior to testing the PLP capacitor 130. By reducing or eliminating the volume of data buffered in the volatile memory device 125 requiring hardening prior to testing the PLP capacitor 130, the amount of time needed to harden the data in the one or more of the non-volatile memory devices 142a-d, 144a-d, 146a-d, and 148a-d is correspondingly reduced, reducing the backup energy requirement for the PLP capacitor 130. As such, even if the PLP capacitor 130 has been discharged below the minimum specified voltage (and corresponding energy capacity) to ensure sufficient backup power for the SSD memory controller 120, the array of non-volatile memory devices 140, and the volatile memory device 125 under normal circumstances where the volume of data buffered by the volatile memory device 125 is not reduced or eliminated by the SSD memory controller 120, and the SSD 100 experiences a power loss or failure event, the reduced energy of the PLP capacitor 130 should still be sufficient for the SSD controller 120 to harden the reduced volume of data in the volatile memory device 125 in the one or more of the non-volatile memory devices 142a-d, 144a-d, 146a-d, and 148a-d.

A reduction in the volume of data stored in the volatile memory device 125 requiring hardening can be achieved in a number of different ways. In one embodiment, the SSD memory controller 120 is configured to withhold the use of a number of write buffers within the volatile memory device 125 prior to testing the PLP capacitor 130. By withholding the write buffers, the amount of data that is buffered in the volatile memory device 125 is correspondingly reduced. The specific number of write buffers withheld will depend on the specific configuration of the volatile memory device 125 and the desired amount of data reduction prior to testing the PLP capacitor 130, among other considerations. For example, if the PLP capacitor 130 is expected to discharge 30% of its energy during the test, then the number of write buffers that are withheld by the SSD memory controller 120 will be greater than if the PLP capacitor 130 is only expected to discharge 10% of its energy during the test.

In one embodiment, the SSD memory controller 120 is configured to reduce credits available to the host device to write data to the SSD 100 prior to testing the PLP capacitor 130. Similar to withholding write buffers, reducing the credits available to the host device to write data to the SSD 100 will correspondingly reduce the amount of data that is buffered in the volatile memory device 125. Again, the specific number of credits reduced will depend on a number of factors as previously discussed, and a greater reduction may be required where the PLP capacitor 130 is expected to discharge a greater amount of energy during the test of the PLP capacitor 130.

In one embodiment, the SSD memory controller 120 is configured to allocate a number of write buffers within the volatile memory device 125 for dummy write operations prior to testing the PLP capacitor 130. By allocating a number of write buffers of the volatile memory device 125 for dummy write operations, the corresponding number of write buffers available for the host write data is reduced, thereby reducing the amount of data in the volatile memory device 125 requiring hardening in the event of a power loss or failure. Again, the specific number of write buffers allocated for dummy write operations will depend on a number of factors as previously discussed, and a greater reduction may be required where the PLP capacitor 130 is expected to discharge a greater amount of energy during testing.

In one embodiment, the SSD memory controller 120 is configured to reduce a number of concurrent write operations to the one or more non-volatile memory devices 142a-d, 144a-d, 146a-d, and 148a-d prior to testing the PLP capacitor 130. Reducing the number of concurrent write operations to the one or more non-volatile memory devices 142a-d, 144a-d, 146a-d, and 148a-d will also reduce the amount of data buffered in the volatile memory device 125 requiring hardening in the event of a power loss or failure. Again, the specific reduction in concurrent write operations will depend on a number of factors as previously discussed, and a greater reduction may be required for the PLP capacitor 130 that is expected to discharge a greater amount of energy during testing.

Each of the aforementioned embodiments for reducing the volume of data buffered by the volatile memory device 125 requiring hardening prior to initiating the test of the PLP capacitor 130 can be implemented in firmware, by hardware, or a mixture of both. Additionally, these embodiments are not mutually exclusive, and can be implemented in conjunction with one another to achieve the desired reduction in data buffered by the volatile memory device 125. For example, the SSD memory controller 120 may be configured to both reduce a number of concurrent write operations to the non-volatile memory devices 142a-d, 144a-d, 146a-d, and 148a-d and to allocate a number of write buffers within the non-volatile memory device for dummy operations prior to testing the PLP capacitor 130. As another example, the SSD memory controller may be configured to further reduce a number of credits available to the host device to write data to the SSD 100, in addition to reducing a number of concurrent write operations to the non-volatile memory devices 142a-d, 144a-d, 146a-d, and 148a-d and allocating a number of write buffers within the non-volatile memory device for dummy operations prior testing the PLP capacitor 130. In these examples, the specific number of concurrent write operations reduced, the specific number of write buffers allocated for dummy operations, and the specific number of credits withheld can be allocated among the various techniques implemented to achieve the desired reduction in the volume of data buffered by the volatile memory device 125 requiring hardening.

In situations where a reduction of the volume of data buffered by the volatile memory device 125 requiring hardening prior to initiating testing of the PLP capacitor 130 is not possible or impractical to implement, the data buffered by the volatile memory device 125 can be eliminated altogether prior to testing the PLP capacitor 130. In this embodiment, all the data buffered in the PLP capacitor 130 requiring hardening is stored in one or more of the non-volatile memory devices 142a-d, 144a-d, 146a-d, and 148a-d, similar to what is done in the event of a power loss or failure event to back up the critical data in the volatile memory device 125, and all writes to the SSD 100 are suspended prior to testing the PLP capacitor 130. By hardening all of the data buffered by the volatile memory device 125 requiring hardening in advance, even if a power loss or failure event occurs during testing of the PLP capacitor 130 and the PLP capacitor 130 is incapable of providing sufficient backup power to the SSD memory controller 120, the array of non-volatile memory devices 140, and the volatile memory device 125, the SSD 100 will not experience any loss of critical data because it has already been saved in one or more of the non-volatile memory devices 142*a-d*, 144*a-d*, 146*a-d*, and 148*a-d*.

Following the completion of the testing of the PLP capacitor 130, the temporary reduction or elimination of the volume of data buffered by the volatile memory device 125 is removed by stopping the corresponding techniques used to reduce or eliminate the volume of data, and normal operation of the SSD 100 is resumed. For example, in one embodiment, if the SSD memory controller 120 is configured to allocate a number of write buffers of the volatile memory device 125 for dummy write operations to reduce the volume of data in the volatile memory device 125 requiring hardening, then, following the completion of the testing of the PLP capacitor 130, the SSD memory controller 120 is further configured to restore those write buffers for regular write operations to the array of non-volatile memory devices 140.

Temporarily reducing or eliminating the volume of data buffered by the volatile memory device 125 requiring hardening may impact the performance of the SSD 100. The overall effect of this impact will depend on a number of factors, including the workload of the SSD 100 at the time the temporary reduction or elimination of the volume of data occurs, and the degree of reduction of the volume of data or if the data is eliminated entirely. For example, if at the scheduled time for the testing of PLP capacitor 130 the SSD 100 is operating at "full-speed," where the write buffers of the volatile memory device 125 are fully utilized, the host device is using all available credits to write data to the SSD 100, etc. such that the throughput of the write operations to the array of non-volatile memory devices 140 is at its maximum, then temporarily reducing the volume of data buffered by the volatile memory device 125 will have a greater impact on the performance of the SSD 100 than if the SSD 100 was operating at less than full-speed. Moreover, eliminating the volume of data buffered by the volatile memory device 125 requiring hardening will have a greater impact on the performance of the SSD 100 than partially reducing the volume of data buffered by the volatile memory device as write operations will be suspended during the duration of the test of the PLP capacitor 130, as explained previously.

However, because the duration of the testing of the PLP capacitor 130 is relatively short, in the 10's of ms, the overall impact on performance, even if the SSD 100 is operating at full-speed, will be relatively minor, with the throughput of write operations to the array of non-volatile memory devices 140 being reduced by a small percentage. If the SSD 100 is operating at less than full-speed, then the impact on performance and throughput of write operations will be even further reduced. Moreover, read operations will remain unaffected. As such, the host device may only perceive a minor, if any, reduction in the overall performance of the SSD 100 in connection with the reduction or elimination of the data buffered by the volatile memory device 125, and any impact on performance of the SSD 100 is outweighed by the benefit of guaranteeing that there will be no loss of critical data during the testing of the PLP capacitor 130 in the event of a power loss or failure.

The impact on the performance of the SSD 100 can also be minimized by, in one embodiment, testing of the PLP capacitor 130 when the SSD 100 is operating at less than full-speed, and more preferably, when the SSD 100 is relatively idle with few host write operations. For example, the SSD 100 may be configured so that the test of the PLP capacitor 130 occurs when the SSD 100 is operating at 75% or less of its maximum throughput for write operations to the array of non-volatile memory devices 140 so that any partial or complete reduction of the volume of data buffered by the volatile memory device 125 prior to and during testing of the PLP capacitor 130 has little or no impact on the overall performance of the SSD 100 and is imperceptible to the host device such that, to the host device, the SSD 100 is operating as normal.

By reducing or eliminating the volume of data buffered by the volatile memory device 125 requiring hardening prior to testing the PLP capacitor 130, the requirements on the PLP capacitor 130 is also correspondingly reduced. As previously explained, because there is a reduced volume of data buffered in the volatile memory device 125, the amount of time the PLP capacitor 130 will need to provide backup power to the SSD memory controller 120, the array of non-volatile memory devices 140, and the volatile memory device 125 is shortened as there is less data in the volatile memory device 125 that will need to be hardened in one or more of the non-volatile memory devices 142*a-d*, 144*a-d*, 146*a-d*, and 148*a-d*.

As such, the PLP capacitor 130 will not need to have as large of an energy storage capacity as would otherwise be required in a conventional SSD without techniques for reducing or eliminating the volume of data buffered by the non-volatile memory device 125 to ensure the volume of data is hardened in one or more of the non-volatile memory devices 142*a-d*, 144*a-d*, 146*a-d*, and 148*a-d* in the event of a power loss or failure during testing of the PLP capacitor 130. This means that the PLP capacitor 130 can have a smaller energy storage capacity, or fewer capacitors will be needed where the PLP capacitor 130 comprises multiple capacitors, reducing the cost of the components of the SSD 100 and possibly saving critical space on the printed circuit board of the SSD 100 upon which the components are mounted.

Figure 2:
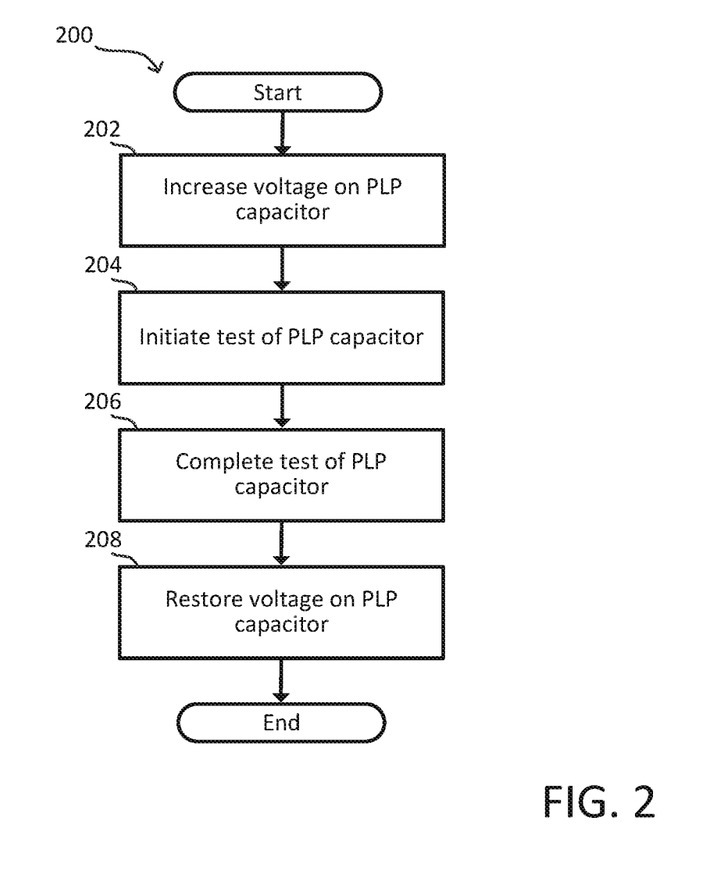
FIG. 2 is a flowchart of method steps for testing a PLP capacitor of an SSD, according to one embodiment of the invention.

FIG. 2 is a flowchart of method steps 200 for testing a PLP capacitor of an SSD, according to one embodiment of the invention. As shown in FIG. 2, at step 202 a voltage of the PLP capacitor is increased. In one embodiment, the PLP capacitor is a de-rated capacitor. In one embodiment, the voltage of the PLP capacitor is increased by an amount that partially or completely offsets an energy discharged during testing of the PLP capacitor. At step 204, after the voltage of the PLP capacitor is increased, the test of the PLP capacitor is initiated. In one embodiment, the test is a discharge test whereby a known load, current source, or resistance is applied across the PLP capacitor and the voltage drop is measured over time as the PLP capacitor discharges through the load. After the test of the PLP capacitor is completed at step 206, the voltage of the PLP capacitor is restored to its normal level prior to the increase. As previously discussed, by increasing the voltage of the PLP capacitor prior to testing the PLP capacitor will ensure that the PLP capacitor will have sufficient energy to harden all necessary volatile data buffered in the volatile memory in the event of a power loss or failure during the testing of the PLP capacitor.

Figure 3:
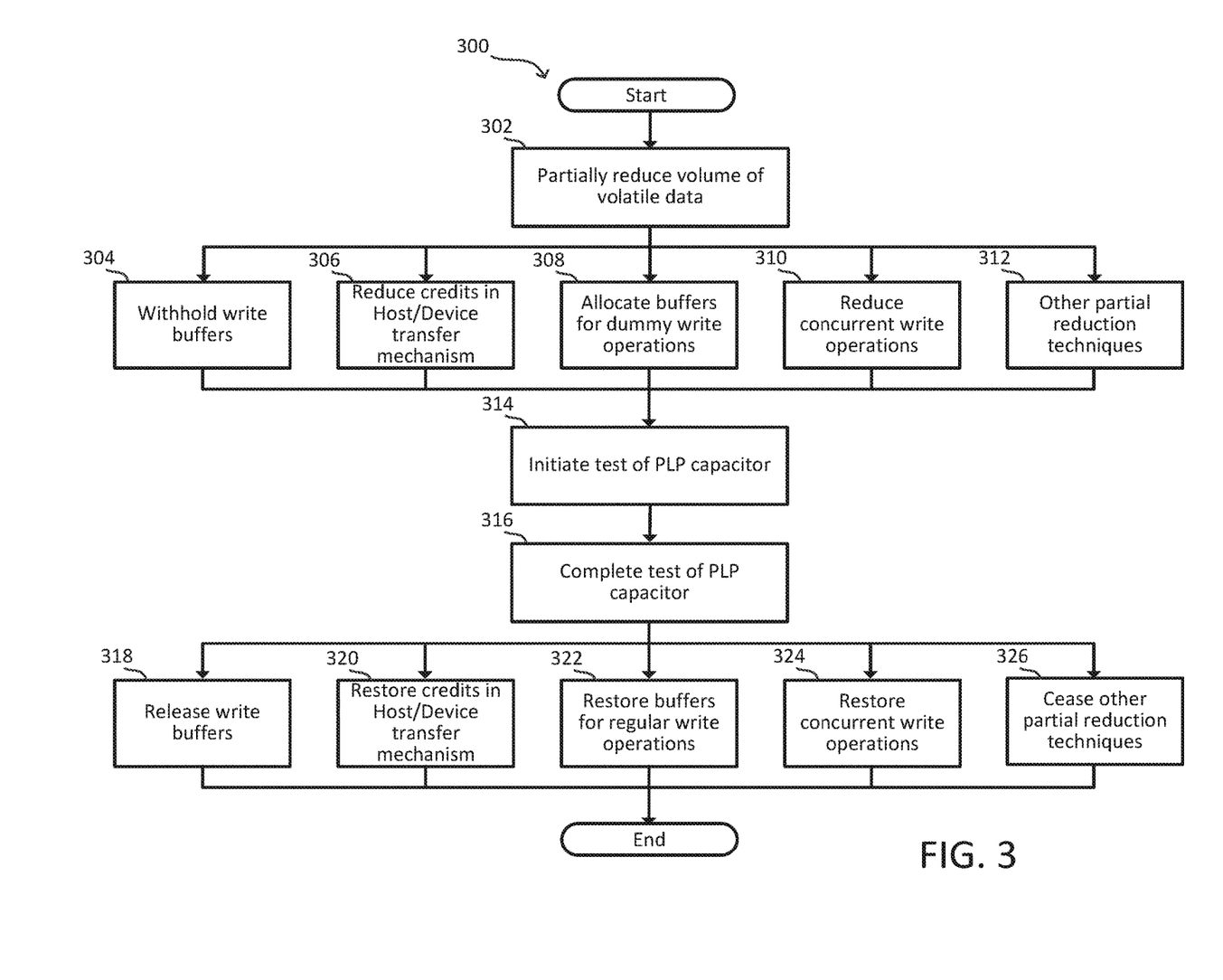
FIG. 3 is a flowchart of method steps for testing a PLP capacitor of an SSD, according to one embodiment of the invention.

FIG. 3 is a flowchart of method steps 300 for testing a PLP capacitor of an SSD, according to one embodiment of the invention. As shown in FIG. 3, at step 302, a volume of data buffered in a volatile memory device of an SSD requiring hardening in one or more non-volatile memory devices in the event of a power loss or failure is reduced. In one embodiment, at step 304, the volume of data is reduced by withholding a number of write buffers of the volatile memory device. By withholding the write buffers, the amount of data that is capable of being buffered in the volatile memory device is correspondingly reduced. As previously discussed, the specific number of write buffers that are withheld will depend on the specific configuration of the volatile memory device and the desired amount of data reduction prior to testing the PLP capacitor.

Alternatively, in one embodiment, at step 306, a number of host credits available to a host device to write data to the SSD is reduced. Similar to withholding write buffers, reducing the credits available to the host device to write data to the SSD will correspondingly reduce the amount of data that is buffered in the volatile memory device. Again, the specific number of credits reduced will depend on a number of factors, including the desired amount of data reduction in the volatile memory device prior to testing the PLP capacitor. In another embodiment, at step 308, a number of write buffers of the volatile memory device are allocated for dummy write operations prior to testing the PLP capacitor, thereby reducing the amount of data that can be buffered in the volatile memory device. The specific number of write buffers allocated will depend on a desired amount of data reduction in the volatile memory device prior to testing the PLP capacitor.

In yet another embodiment, at step 310, a number of concurrent write operations to the one or more non-volatile memory devices is reduced, also reducing the amount of data that is buffered in the volatile memory device. The specific reduction of concurrent write operations will depend on a desired amount of data reduction in the volatile memory device prior to testing the PLP capacitor. In yet another embodiment, at step 312, any other suitable technique for reducing a volume of volatile data buffered in the volatile memory device and requiring hardening may be implemented, or, any combination of the techniques described in steps 304, 306, 308, and 310 may be implemented to achieve a desired reduction in the volume of data.

Again, as previously discussed, by reducing the volume of data in the non-volatile memory device requiring hardening in the event of a power loss or failure prior to testing the PLP capacitor, the backup power requirement of the PLP capacitor is reduced as the PLP capacitor will only have to provide backup power for a shortened period of time as less data needs to be hardened in one or more of the non-volatile memory devices, thereby ensuring that all necessary data will be buffered in the non-volatile memory devices, even if the PLP capacitor has a reduced energy capacity due to the testing.

After the desired reduction in the volume of data buffered in the volatile memory device is achieved, at step 314, the test of the PLP capacitor is initiated. In one embodiment, the test is a discharge test. After the PLP capacitor test has been completed at step 316, at steps 318, 320, 322, 324, and 326, the corresponding technique or techniques used to achieve the reduction in the volume of data are reversed and normal operation of the SSD is restored. For example, if at step 304 a number of write buffers were withheld, then at step 318 those write buffers are released and are able to be used for write operations to the non-volatile memory devices. Similarly, if at step 308 a number of write buffers were allocated for dummy write operations, then at step 322 those write buffers are restored for regular write operations.

Figure 4:
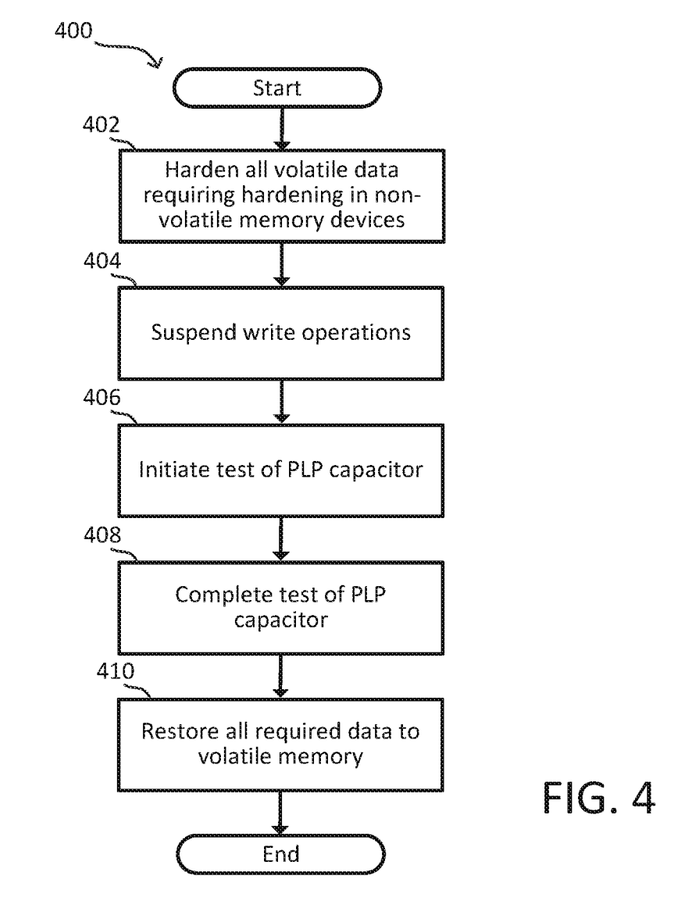
FIG. 4 is a flowchart of method steps for testing a PLP capacitor of an SSD, according to one embodiment of the invention.

FIG. 4 is a flowchart of method steps 400 for testing a PLP capacitor of an SSD, according to one embodiment of the invention. As previously discussed, where a partial reduction in the volume of data buffered by the volatile memory device is not possible or practical, the data buffered by the volatile memory device can be eliminated altogether prior to testing the PLP capacitor similar to what is done in the event of a power loss or failure. At step 402, all necessary data buffered by the volatile memory device requiring hardening is hardened in one or more non-volatile memory devices. After the data is hardened, at step 404, write operations are suspended. At step 406, the PLP capacitor test is initiated. In one embodiment, the test is a discharge test. After the PLP capacitor test has been completed at step 408, at step 410 the hardened data is restored to the volatile memory device and normal operation of the SSD is restored, including write operations that were previously suspended at step 404. As also previously discussed, by hardening all of the data buffered by the volatile memory device requiring hardening at step 402 and suspending write operations 404 prior to initiating testing of the PLP capacitor at step 406, even if a power loss or failure event occurs during testing of the PLP capacitor and the PLP capacitor is incapable of providing sufficient backup power, the SSD will not experience any loss of critical data because it has already been hardened in one or more of the non-volatile memory devices at step 402 prior to testing the PLP capacitor.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A memory storage device comprising:
a memory controller;
one or more non-volatile memory devices;
a volatile memory device; and
a power loss protection (PLP) device configured to supply a first voltage to the memory controller, the one or more non-volatile memory devices, and the volatile memory device in the event of a power loss or failure of the memory storage device, wherein
the PLP device is further configured to be increased from a first energy corresponding to the first voltage to a second energy prior to performing a test of a degradation of the PLP device.

2. The memory storage device comprising of claim 1, wherein the test is a discharge test.

3. The memory storage device comprising of claim 1, wherein the PLP device is a capacitor.

4. The memory storage device comprising of claim 1, wherein the PLP device is restored to the first energy after testing the PLP device.

5. The memory storage device comprising of claim 2, wherein the energy increase to the second energy corresponds to an increase in energy that is substantially equal to the energy lost by the PLP device during testing of the PLP device.

6. The memory storage device comprising of claim 2, wherein the energy increase to the second energy corresponds to an increase in energy that is in excess of the energy lost by the PLP device during testing of the PLP device.

7. The memory storage device comprising of claim 1, wherein the memory storage device comprises a Solid State Drive (SSD).

8. The memory storage device comprising of claim 1, wherein the memory controller is further configured to reduce a volume of data stored in the volatile memory device requiring hardening in the event of the power loss or failure of the memory storage device prior to performing a test of a degradation of the PLP device.

9. The memory storage device of claim 8, wherein the memory controller is further configured to store all of the data in the volatile memory device requiring hardening in the one or more non-volatile memory devices prior to testing the PLP device.

10. The memory storage device of claim 9, wherein the memory controller is further configured to restore all of the data in the volatile memory device requiring hardening from the one or more non-volatile memory devices after testing the PLP device.

11. The memory storage device of claim 1, wherein the PLP device comprises a plurality of capacitors.

12. A method for testing a power loss protection (PLP) device of a memory storage device, the method comprising:
increasing an energy of the PLP device from a first energy corresponding to a first voltage to a second energy; and
testing a degradation of the PLP device,
wherein the PLP device is configured to supply the first voltage to a memory controller, one or more non-volatile memory devices, and a volatile memory device in the event of a power loss or failure of the memory storage device.

13. The method of claim 12, wherein the testing is discharge testing.

14. The method of claim 12, the method further comprising restoring the PLP device to the first energy corresponding to the first voltage after testing the PLP device.

15. The method of claim 12, further comprising:
applying a load, current source, or resistance to the PLP device for a first time period; and
measuring a drop in the voltage of the PLP device over the first time period.

16. The method of claim 12, further comprising:
removing the load, current source, or resistance from the PLP device after the first time period; and
restoring the energy of the PLP device to the first energy corresponding to the first voltage.

17. The method of claim 12, wherein the PLP device is a capacitor.

18. The method of claim 12, wherein the memory storage device comprises a Solid State Drive (SSD).

19. The method of claim 12, the method further comprising reducing a volume of data stored in a volatile memory device by a memory controller communicatively coupled to the volatile memory device, the volume of data requiring hardening in one or more non-volatile memory devices communicatively coupled to the memory controller.

20. The method of claim 19 the method further comprising storing all of the data in the volatile memory device requiring hardening in the one or more non-volatile memory devices prior to testing the PLP device.

21. The method of claim 19, the method further comprising restoring all of the data in the volatile memory device requiring hardening from the one or more non-volatile memory devices after testing the PLP device.

22. The method of claim 19, wherein the PLP device is a plurality of capacitors.

* * * * *